(12) United States Patent
Kusuda

(10) Patent No.: US 11,442,494 B2
(45) Date of Patent: Sep. 13, 2022

(54) APPARATUS AND METHODS FOR CONTROLLING A CLOCK SIGNAL

(71) Applicant: Analog Devices, Inc., Norwood, MA (US)

(72) Inventor: Yoshinori Kusuda, San Jose, CA (US)

(73) Assignee: Analog Devices, Inc., Norwood, MA (US)

( * ) Notice: Subject to any disclaimer, the term of this patent is extended or adjusted under 35 U.S.C. 154(b) by 214 days.

(21) Appl. No.: 16/946,142

(22) Filed: Jun. 8, 2020

(65) Prior Publication Data

US 2021/0382517 A1    Dec. 9, 2021

(51) Int. Cl.
| | |
|---|---|
| *G06F 1/08* | (2006.01) |
| *G06F 1/12* | (2006.01) |
| *H03L 7/099* | (2006.01) |
| *H03L 7/24* | (2006.01) |
| *H03M 1/12* | (2006.01) |

(52) U.S. Cl.
CPC .................. *G06F 1/08* (2013.01); *G06F 1/12* (2013.01); *H03L 7/099* (2013.01); *H03L 7/24* (2013.01); *H03M 1/12* (2013.01)

(58) Field of Classification Search
CPC ... G06F 1/08; G06F 1/12; H03L 7/099; H03L 7/24; H03M 1/12
See application file for complete search history.

(56) References Cited

U.S. PATENT DOCUMENTS

| 5,404,338 A | 4/1995 | Murai et al. |
| 5,774,701 A * | 6/1998 | Matsui ..................... G06F 1/08 |
| | | 713/601 |
| 5,793,257 A * | 8/1998 | Inanami ............... H03K 3/0231 |
| | | 331/25 |
| 5,926,641 A | 7/1999 | Shay |
| (Continued) | | |

FOREIGN PATENT DOCUMENTS

| CN | 101841229 B | 9/2012 |
| EP | 0905602 A2 | 3/1999 |
| (Continued) | | |

OTHER PUBLICATIONS

Extended European Search Report for International Application No. 21178081.2 dated Nov. 8, 2021, in 10 pages.

(Continued)

*Primary Examiner* — Aurel Prifti
(74) *Attorney, Agent, or Firm* — Knobbe, Martens, Olson & Bear, LLP

(57) ABSTRACT

Apparatus and methods for controlling a clock signal are provided. In certain embodiments, a semiconductor die includes a core circuit and a clock interface circuit that provides a clock signal to the core circuit. The clock interface circuit includes an oscillator for generating an oscillator signal, and a comparator for controlling operation of the clock interface circuit in a selected clock control mode based on comparing an electrical characteristic of the clock interface pin to a comparison threshold. The selected clock control mode is chosen from a first clock control mode in (Continued)

which the clock interface circuit generates the clock signal based on an input clock signal received on a clock interface pin, or a second clock control mode in which the clock interface circuit generates the clock signal based on the oscillator signal.

20 Claims, 9 Drawing Sheets

(56) References Cited

U.S. PATENT DOCUMENTS

| | | | |
|---|---|---|---|
| 5,946,268 A | 8/1999 | Iwamoto et al. | |
| 5,991,888 A * | 11/1999 | Faulkner | G01R 31/3016 |
| | | | 702/120 |
| 6,157,265 A * | 12/2000 | Hanjani | G06F 1/08 |
| | | | 331/49 |
| 6,230,280 B1 | 5/2001 | Okasaka | |
| 6,271,697 B1 | 8/2001 | Hayashi et al. | |
| 6,442,407 B1 * | 8/2002 | Bauer | G06F 1/3287 |
| | | | 455/343.1 |
| 6,449,728 B1 | 9/2002 | Bailey | |
| 6,522,599 B2 | 2/2003 | Ooishi et al. | |
| 6,614,713 B2 | 9/2003 | Tanizaki et al. | |
| 7,250,821 B2 | 7/2007 | Momii et al. | |
| 7,274,185 B2 | 9/2007 | Kim | |
| 7,332,950 B2 | 2/2008 | Blodgett | |
| 7,382,681 B2 * | 6/2008 | Yada | H03L 7/08 |
| | | | 331/34 |
| 7,555,667 B1 * | 6/2009 | Burney | H03K 19/17716 |
| | | | 713/401 |
| 8,203,357 B2 | 6/2012 | Kusuda et al. | |
| 8,319,567 B1 * | 11/2012 | Audy | H03K 4/08 |
| | | | 331/172 |
| 9,224,451 B2 | 12/2015 | Fujisawa | |
| 9,373,420 B2 | 6/2016 | Lee | |
| 9,490,824 B1 * | 11/2016 | Singh | H03L 7/089 |
| 2002/0073352 A1 * | 6/2002 | Okubo | G06F 1/3203 |
| | | | 713/600 |
| 2003/0098730 A1 * | 5/2003 | Miyazaki | G06F 1/3203 |
| | | | 327/158 |
| 2003/0132806 A1 * | 7/2003 | Takenaka | H03L 7/0805 |
| | | | 331/17 |
| 2004/0165472 A1 | 8/2004 | Yamazaki | |
| 2015/0256169 A1 * | 9/2015 | Kusuda | H03F 1/0205 |
| | | | 327/382 |
| 2019/0052226 A1 * | 2/2019 | Rozental | H03L 7/0995 |
| 2019/0158034 A1 | 5/2019 | Sloboda et al. | |
| 2020/0159278 A1 * | 5/2020 | Pereira | H03L 7/0991 |

FOREIGN PATENT DOCUMENTS

| | | |
|---|---|---|
| JP | 2003059298 A | 2/2003 |
| JP | 3550143 B2 | 8/2004 |
| JP | 3718251 B2 | 11/2005 |
| JP | 2011158440 A | 8/2011 |
| WO | WO-2008039704 A1 * | 4/2008 ............ G06F 1/08 |
| WO | WO2008039704 A1 | 4/2008 |

OTHER PUBLICATIONS

Analog Devices, Inc. AD7792/AD7793 "3-Channel, Low Noise, Low Power, 16-/24-Bit Σ-Δ ADC with On-Chip In-Amp and Reference," dated 2007, in 32 pages.
Linear Technology, LTC 1050, "Precision Zero-Drift Operational Amplifier with Internal Capacitors," dated Aug. 2007, in 16 pages.
Microchip Technology Inc. TC7652 "Low Noise, Chopper Stabilized Operational Amplifier," dated 2012, in 18 pages.
Richtek, RT2852BH "3A, 18V, Synchronous Step-Down Converter," dated Jun. 2019, in 19 pages.
Texas Instruments, PGA280 Zero-Drift, High-Voltage Programmable Gain Instrumentation Amplifier, Jun. 2009, in 49 pages.
Texas Instruments, TPS54A20 8-V to 14-V Input, 10-A, up to 10-MHz SWIFT™ Step Down Converter, dated Dec. 2015, in 43 pages.

* cited by examiner

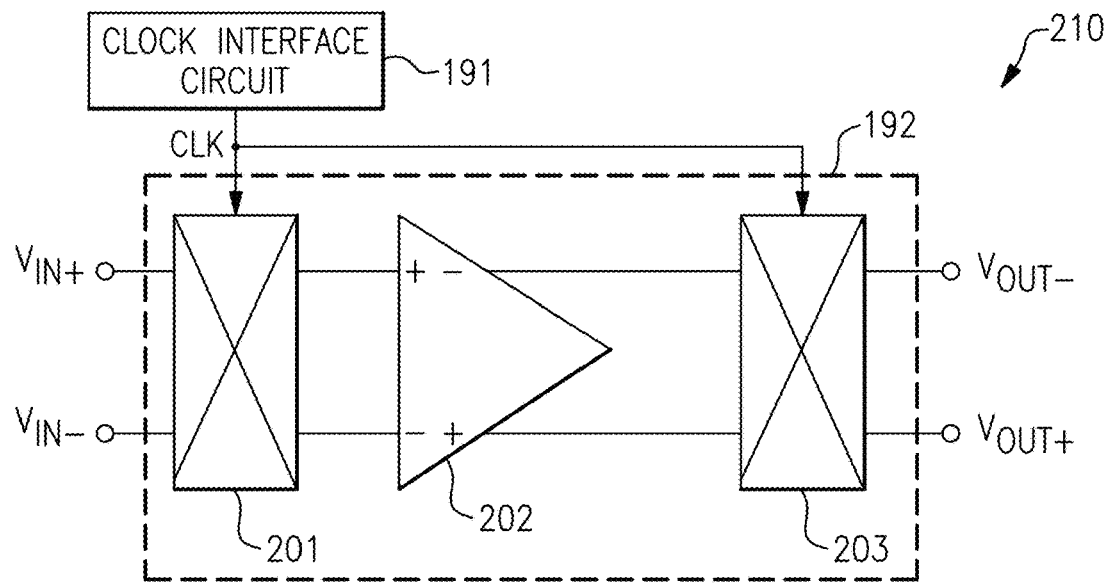
FIG.7A
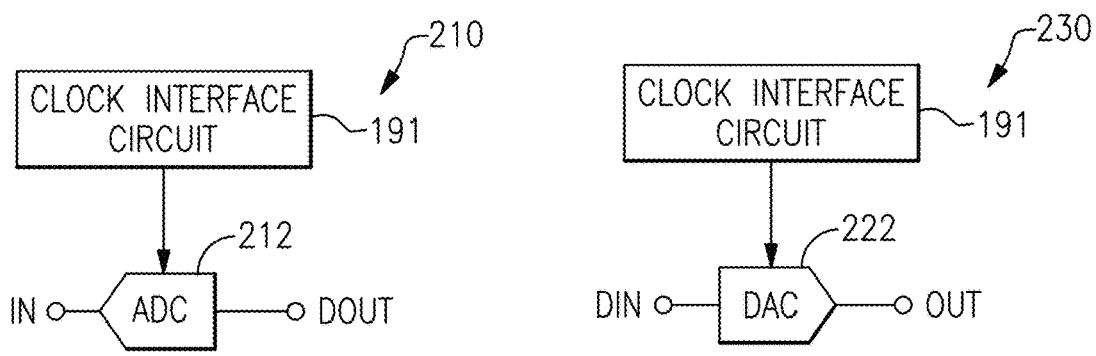
FIG.7B
FIG.7C
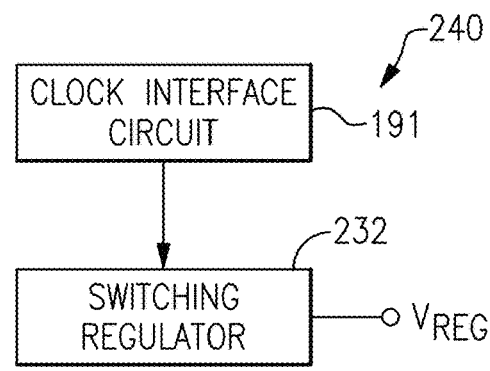
FIG.7D

APPARATUS AND METHODS FOR CONTROLLING A CLOCK SIGNAL

FIELD OF THE DISCLOSURE

Embodiments of the invention relate to electronic systems, and more particularly, to clock interface circuits for integrated circuits (ICs).

BACKGROUND

A wide variety of electronic systems operate based on timing of clock signals. For instance, examples of electronic circuitry that operate based on clock signal timing include, but are not limited to, analog-to-digital converters (ADCs), digital-to-analog converters (DACs), data communication links, amplifiers, digital circuits, and/or voltage regulators.

SUMMARY OF THE DISCLOSURE

Apparatus and methods for controlling a clock signal are provided. In certain embodiments, a semiconductor die includes a core circuit and a clock interface circuit that provides a clock signal to the core circuit. The semiconductor die further includes multiple pins or pads, including at least a supply voltage pin and a clock interface pin coupled to the clock interface circuit. The clock interface circuit includes an oscillator for generating an oscillator signal, and a comparator for controlling operation of the clock interface circuit in a selected clock control mode chosen from two or more clock control modes based on comparing an electrical characteristic of the clock interface pin to a comparison threshold. The two or more clock control modes include a first clock control mode in which the clock interface circuit generates the clock signal based on an input clock signal received on the clock interface pin, and a second clock control mode in which the clock interface circuit generates the clock signal based on the oscillator signal. Accordingly, the clock interface circuit provides flexibility in controlling the clock signal provided to the core circuit.

In one aspect, a semiconductor die with clock control is provided. The semiconductor die includes a plurality of pins including a supply pin and a first clock interface pin. The semiconductor die further includes a clock interface circuit configured to output a clock signal, the clock interface circuit coupled to the supply pin and the first clock interface pin. The clock interface circuit includes an oscillator configured to generate an oscillator signal, and a first comparator configured to control operation of the clock interface circuit in a selected clock control mode chosen from two or more clock control modes based on comparing an electrical characteristic of the first clock interface pin to a comparison threshold. The two or more clock control modes includes a first clock control mode in which the clock interface circuit generates the clock signal based on an input clock signal received on the clock interface pin, and a second clock control mode in which the clock interface circuit generates the clock signal based on the oscillator signal.

In another aspect, a method of clock control in an electronic system is provided. The method includes controlling timing of a core circuit using a clock signal provided by a clock interface circuit coupled to a supply pin and a first clock interface pin, comparing an electrical characteristic of the first clock interface pin to a comparison threshold using a comparator of the clock interface circuit, and operating the clock interface circuit in a selected clock control mode chosen from two or more clock control modes based on the comparison, including generating the clock signal based on an input clock signal received on the clock interface pin in a first clock control mode, and generating the clock signal using an oscillator of the clock interface circuit in a second clock control mode.

In another aspect, an electronic system is provided. The electronic system includes a power supply configured to generate a supply voltage, and a first semiconductor die. The first semiconductor die includes a supply pin configured to receive the supply voltage, a clock interface pin, and a clock interface circuit configured to output a clock signal. The clock interface circuit includes an oscillator configured to generate an oscillator signal, and a first comparator configured to control operation of the clock interface circuit in a selected clock control mode chosen from two or more clock control modes based on comparing an electrical characteristic of the first clock interface pin to a comparison threshold. The two or more clock control modes includes a first clock control mode in which the clock interface circuit generates the clock signal based on an input clock signal received on the clock interface pin, and a second clock control mode in which the clock interface circuit generates the clock signal based on the oscillator signal.

BRIEF DESCRIPTION OF THE DRAWINGS

FIG. 7A is a schematic diagram of another embodiment of a semiconductor die.

FIG. 7B is a schematic diagram of another embodiment of a semiconductor die.

FIG. 7C is a schematic diagram of another embodiment of a semiconductor die.

FIG. 7D is a schematic diagram of another embodiment of a semiconductor die.

DETAILED DESCRIPTION OF EMBODIMENTS

Figure 1:
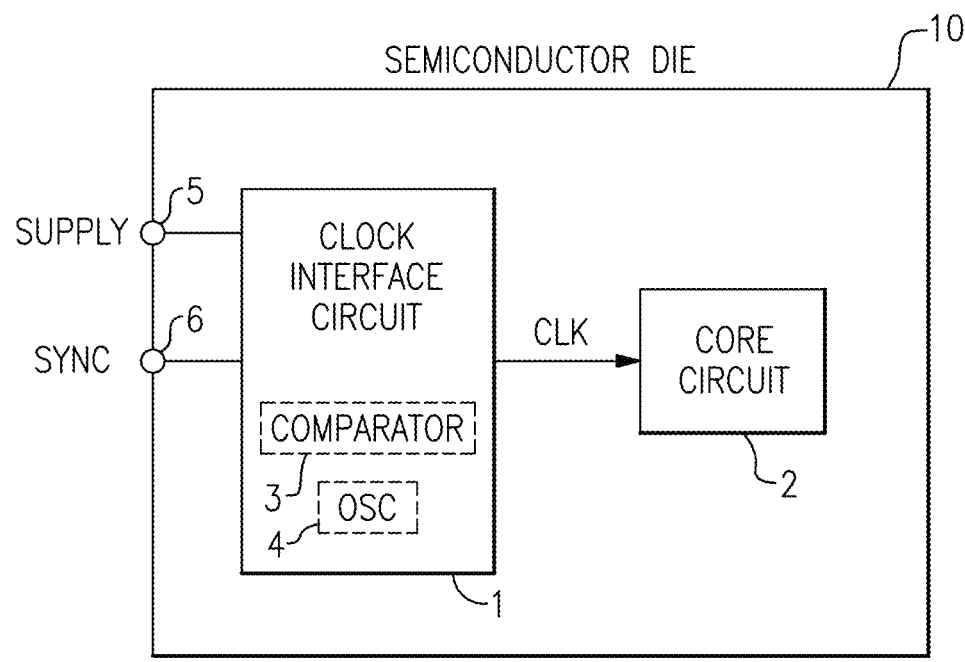
FIG. 1 is a schematic diagram of a semiconductor die including clock interface circuitry according to one embodiment.

The following detailed description of embodiments presents various descriptions of specific embodiments of the invention. However, the invention can be embodied in a multitude of different ways. In this description, reference is made to the drawings where like reference numerals may indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Apparatus and methods for controlling a clock signal are provided. In certain embodiments, a semiconductor die includes a core circuit and a clock interface circuit that provides a clock signal to the core circuit. The semiconductor die further includes multiple pins or pads, including at least a supply voltage pin and a clock interface pin coupled to the clock interface circuit. The clock interface circuit includes an oscillator for generating an oscillator signal, and a comparator for controlling operation of the clock interface circuit in a selected clock control mode chosen from two or more clock control modes based on comparing an electrical characteristic of the clock interface pin to a comparison threshold. The two or more clock control modes include a first clock control mode in which the clock interface circuit generates the clock signal based on an input clock signal received on the clock interface pin, and a second clock control mode in which the clock interface circuit generates the clock signal based on the oscillator signal.

Accordingly, the clock interface circuit provides flexibility in controlling the clock signal provided to the core circuit.

For example, using the first clock control mode, the semiconductor die can be deployed in a first application in which it is desirable for the core circuit to be clocked using an input clock signal provided to the clock interface pin. For instance, the core circuit can communicate with another circuit external to the semiconductor die (for instance, a data converter), and a common clock signal can be used to control timing of both the core circuit and the external circuit to avoid intermodulation-distortion and/or aliasing. When operating in the first clock control mode, the frequency of the input clock signal can be changed as needed, and/or stopped and resumed as desired.

Furthermore, using the second clock control mode, the semiconductor die can further be deployed in a second application in which the clock interface circuit's oscillator generates the clock signal for the core circuit. For instance, in certain use cases a default oscillation frequency of the oscillator may be suitable for clocking the core circuit, thereby reducing cost by avoiding a need for an external clock source.

Accordingly, the clock interface circuit provides enhanced flexibility to enable the same semiconductor die to be used in a wide range of applications. Thus, a need to manufacture many different types of semiconductor dies each with a custom clock design is avoided.

In certain implementations, the comparison threshold of the comparator is generated based on a voltage level of the supply voltage pin. For example, the clock interface circuit can include a bias voltage source that shifts the supply voltage to generate a reference voltage for serving as the comparison threshold.

Implementing the clock interface circuit in this manner provides a number of advantages, including an ability to operate the clock interface circuit in the second clock control mode by tying the clock interface pin to the supply voltage pin, either directly or through an impedance (for instance, an external resistor).

In certain implementations, when operating in the second clock control mode, the voltage level of the clock interface pin is used to tune an oscillation frequency of the oscillator. In such implementations, flexibility is further enhanced by providing a mechanism for the clock interface circuit's oscillator to be tuned.

The voltage level of the clock interface pin can be set to a desired voltage level in a wide variety of ways, such as by connecting a resistor of a particular resistance between the supply voltage pin and the clock interface pin, thereby setting the voltage level of the clock interface pin to a particular voltage level corresponding to the desired oscillation frequency. In another example, a digital-to-analog convert (DAC) or other external control circuit sets the tuning voltage, which can be changed over time to achieve a desired oscillation frequency.

In certain implementations, the clock interface circuit includes multiple clock interface pins, for instance, a pair of clock interface pins that are implemented differentially. For example, using a pair of differential clock interface pins allows a differential input clock signal to be supplied in the first clock control mode, which provides the advantage of lower clock noise and/or reduced jitter relative to a single-ended configuration.

In the embodiments described above, the core circuit is integrated on the same semiconductor die as the clock interface circuit. However, other configurations are possible. In another embodiment, the clock interface circuit and the core circuit are on separate semiconductor dies, which can be co-packaged in a module. In yet another embodiment, the core circuit is integrated on-chip with the clock interface circuit, but the clock signal is also provided off-chip for an external component, which can be, for example, a core circuit of another semiconductor die.

FIG. 1 is a schematic diagram of a semiconductor die 10 according to one embodiment. The semiconductor die 10 includes a clock interface circuit 1, a core circuit 2, a supply voltage pin 5 (SUPPLY), and a clock interface pin 6 (SYNC). A semiconductor die, such as the semiconductor die 10 of FIG. 1, is also referred to herein as a semiconductor chip or integrated circuit (IC).

The supply voltage pin 5 and the clock interface pin 6 correspond to pins (for instance, bond pads) of the semiconductor die 10. Although depicted as including only two pins, the semiconductor die 10 typically includes additional pins as well as additional circuitry for achieving desired operation or functionality. Such details have been omitted from FIG. 1 for clarity.

As shown in FIG. 1, the semiconductor die 10 includes the core circuit 2, which has timing controlled by a clock signal CLK provided by the clock interface circuit 1. The performance of the core circuit 2 is impacted by a number of operational parameters of the clock signal CLK, including, but not limited to, frequency, phase, and/or noise.

The core circuit 2 can correspond to a wide variety of circuits. For instance, examples of circuitry that can included in the core circuit 2 includes data converters, digital circuits, amplifiers, frequency synthesizers, voltage regulators, and/or data communication circuits. The clock interface circuits herein can provide a clock signal to a wide variety of types of circuits.

The desired properties of the clock signal CLK (such as frequency) can vary from one application to another. Furthermore, it is desirable for the semiconductor die 10 to be used across a wide range of applications, without needing to custom-design the semiconductor die 10 to have clock signal characteristics suitable for one particular application.

To provide flexibility in controlling the clock signal CLK, the semiconductor die 10 includes the clock interface circuit 1, which is coupled to the supply voltage pin 5 and the clock interface pin 6, in this embodiment. The clock interface circuit 1 senses an electrical characteristic of the clock interface pin 6, and chooses a clock control mode for controlling the clock signal CLK based on the sensed characteristic.

For example, the clock interface circuit 1 of FIG. 1 includes a comparator 3, which compares an electrical characteristic (for instance, a voltage level) of the clock interface pin 6 to a comparison threshold. Additionally, the result of the comparison is used to set the clock interface circuit 1 in the selected clock control mode. In certain implementations, the comparison threshold of the comparator 3 is generated based on a voltage level of the supply voltage pin 5. The supply voltage pin 5 can correspond to any supply voltage pin, including a positive supply voltage pin, a negative supply voltage pin, or a ground pin.

With continuing reference to FIG. 1, the clock interface circuit 1 further includes an oscillator 4, which generates an internal oscillator signal when enabled.

The clock interface circuit 1 of FIG. 1 is operable in two or more clock control modes, including at least a first clock control mode in which the clock interface circuit 1 generates the clock signal CLK based on an input clock signal received on the clock interface pin 6, and a second clock control mode in which the clock interface circuit 1 generates the clock signal CLK based on the oscillator signal from the oscillator 4. The selected clock control mode is chosen based on the comparison of the comparator 3.

In certain implementations, when operating in the second clock control mode, the voltage level of the clock interface pin 6 is used to tune an oscillation frequency of the oscillator 4. In such implementations, flexibility is further enhanced by providing a mechanism for the clock interface circuit's oscillator 4 to be tuned.

Figure 2A:
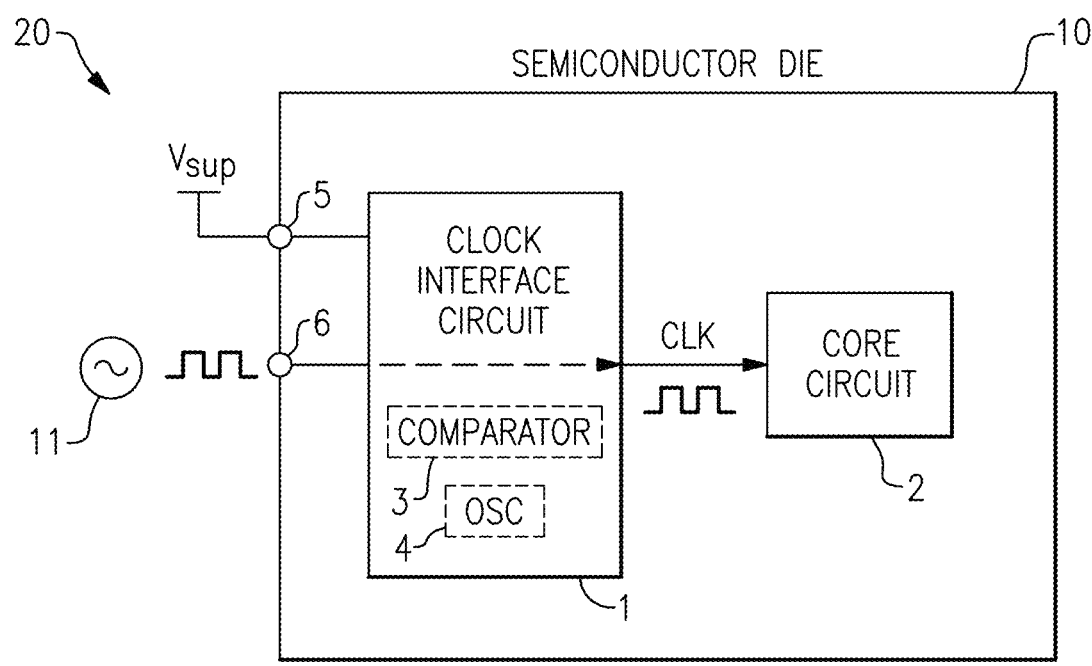
FIG. 2A is a schematic diagram depicting one example of a first clock control mode of the semiconductor die of FIG. 1.

FIG. 2A is a schematic diagram depicting one example of a first clock control mode 20 of the semiconductor die 10 of FIG. 1. As shown in FIG. 2A, a supply voltage $V_{sup}$ has been supplied to the supply voltage pin 5, and an external clock source 11 has provided an input clock signal to clock interface pin 6.

The clock interface control circuit 1 operates in the first clock control mode in this configuration. Thus, the input clock signal provided to the clock interface pin 6 is used to generate the clock signal CLK for the core circuit 2. In certain implementations, when operating the first clock control mode, the clock signal CLK corresponds to a buffered version of input clock signal, and thus has the same frequency.

In certain implementations, the comparator 3 compares a voltage level of the clock interface pin 6 to a threshold voltage, and sets the selected clock control mode based on a result of the comparison. Additionally, the clock source 11 controls a voltage level of the input clock signal, including both when the input clock signal is at a peak amplitude level and a minimum amplitude level, to be below or above the threshold voltage of the comparator 3 such that the output of the comparator 3 does not change as the input clock signal toggles.

Thus, the clock source 11 sets a voltage level of the clock interface pin 6 to inform the clock interface circuit 1 to operate in the first clock control mode. Additionally, the clock source 11 provides the input clock signal to the clock interface circuit 1, which is used by the clock interface circuit 1 to generate the clock signal CLK for the core circuit 2.

When operating in the first clock control mode, the frequency of the input clock signal can be changed as needed, and/or stopped and resumed as desired. Thus, the clock source 11 need not generate the input clock signal to be of fixed frequency. Moreover, the clock source 11 can enable or disable the input clock signal as desired.

Figure 2B:
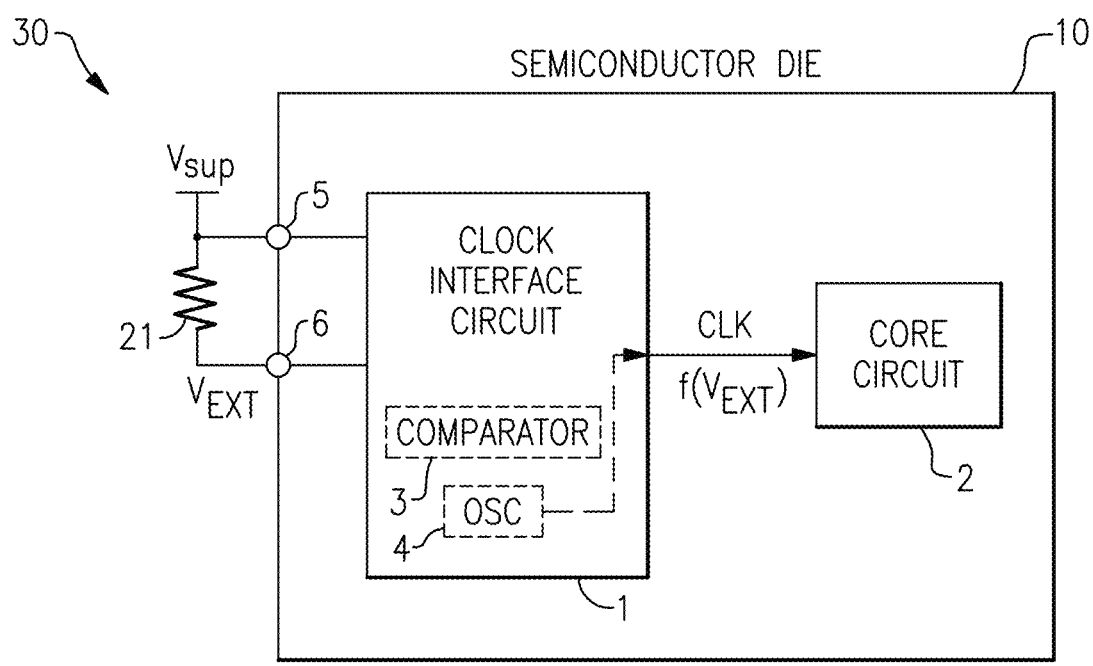
FIG. 2B is a schematic diagram depicting one example of a second clock control mode of the semiconductor die of FIG. 1.

FIG. 2B is a schematic diagram depicting one example of a second clock control mode 30 of the semiconductor die 10 of FIG. 1. As shown in FIG. 2B, a supply voltage $V_{sup}$ has been supplied to the supply voltage pin 5, and an external resistor 21 has been connected between the supply voltage pin 5 and the clock interface pin 6.

The clock interface control circuit 1 operates in the second clock control mode in this configuration. Thus, an internal oscillator signal from the oscillator 4 is used to generate the clock signal CLK for the core circuit 2.

In certain implementations, when operating in the second clock control mode, a voltage $V_{EXT}$ at the clock interface pin 6 is used to set an oscillation frequency of the internal oscillator signal, and thus the frequency of the clock signal CLK.

In such implementations, a resistor value corresponding to a desired oscillation frequency of the oscillator 4 can be chosen for connecting between the supply pin 5 and the clock interface pin 6. Thus, by simply choosing a resistor of a particular resistance, the end-user can instruct the clock interface circuit 1 to use the oscillator 4 to generate the clock signal CLK, with the resistance value used to set $V_{EXT}$ and thus the oscillation frequency of the oscillator 4.

Figure 2C:
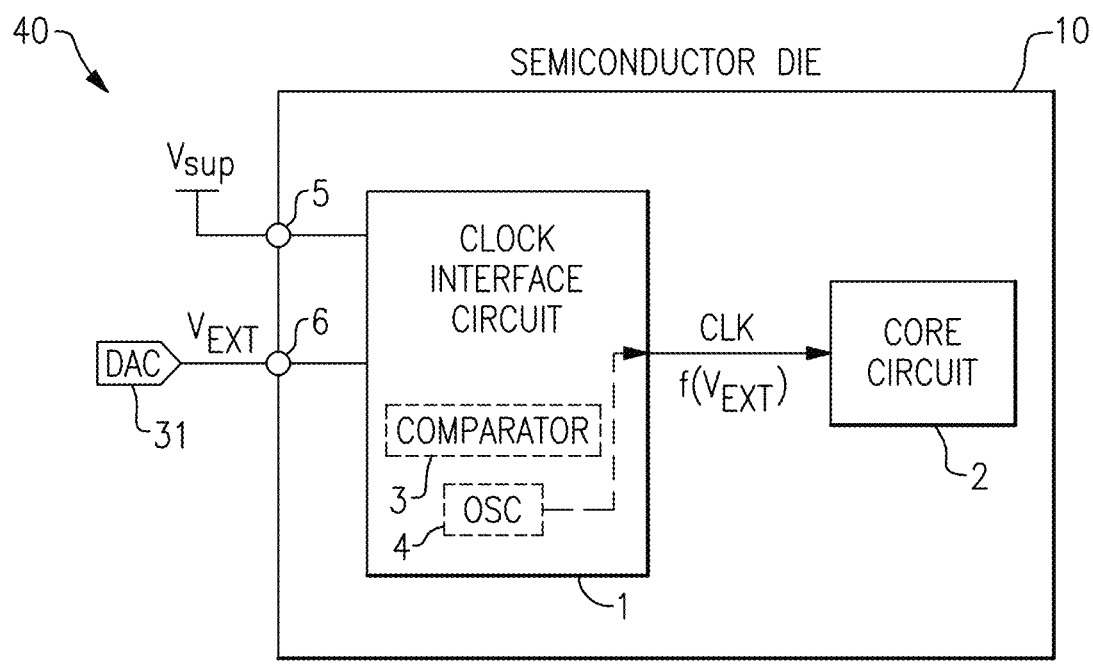
FIG. 2C is a schematic diagram depicting another example of the second clock control mode of the semiconductor die of FIG. 1.

FIG. 2C is a schematic diagram depicting another example of the second clock control mode 40 of the semiconductor die 10 of FIG. 1. In comparison to the example of FIG. 2B, a DAC 31 is used to set the voltage level $V_{EXT}$ of the clock interface pin 6 rather than a resistor.

A wide range of external control circuits can be used to set the voltage level $V_{EXT}$ of the clock interface pin 6. Thus, although examples using a resistor and a DAC have been depicted in FIGS. 2B and 2C, the second clock control mode can be set in other ways.

In the illustrated embodiment, the DAC 31 provides enhanced flexibility in tuning or adjusting the oscillation frequency of the oscillator 4. Thus, the DAC 31 can be suitable for applications in which it is desirable to dynamically change the oscillation frequency of the oscillator 4, for instance, in applications in which the operational frequency changes over time and/or in applications in which the oscillation frequency is adjusted to account for variation in operating conditions, such as temperature and/or supply voltage.

Figure 3:
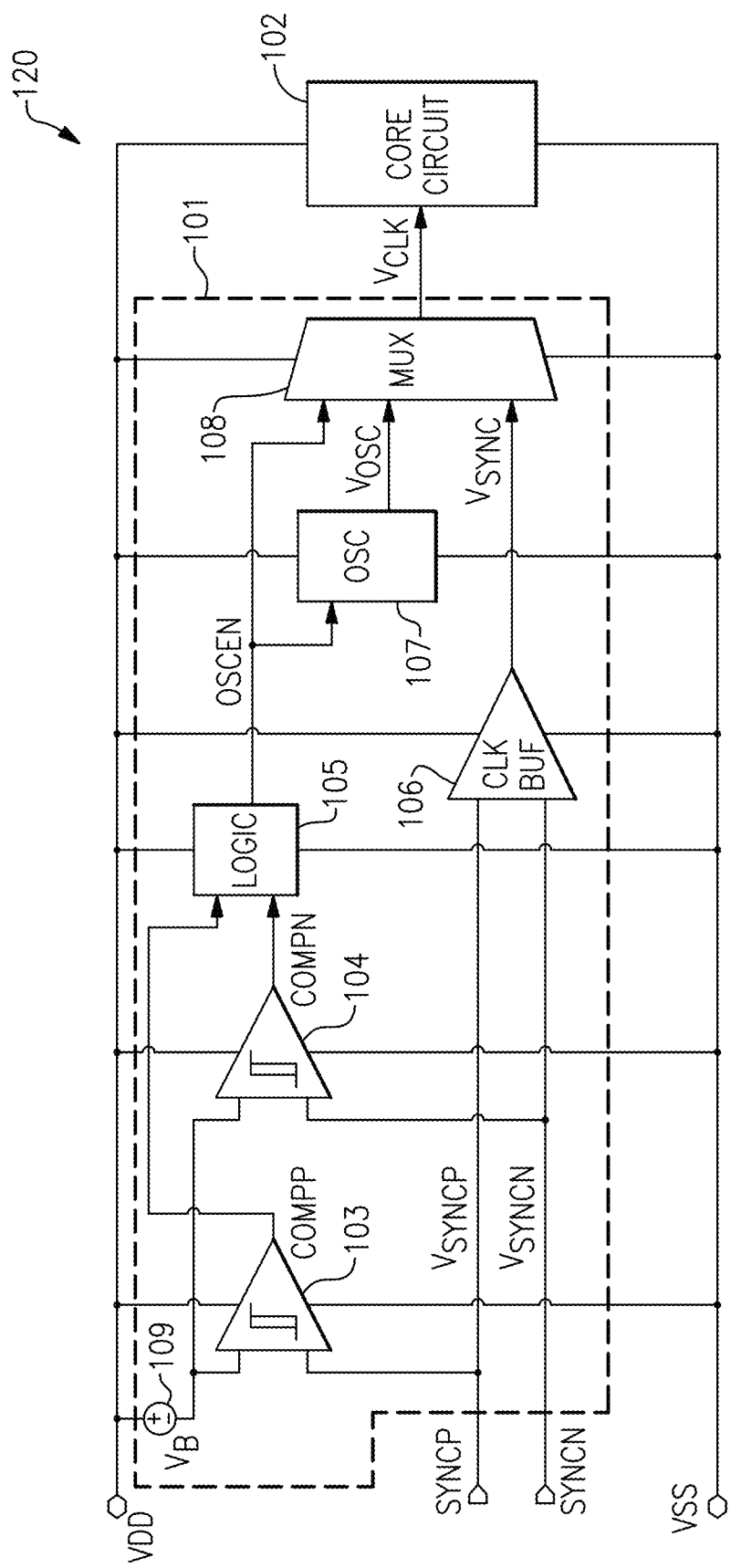
FIG. 3 is a schematic diagram of a semiconductor die including clock interface circuitry according to another embodiment.

FIG. 3 is a schematic diagram of a semiconductor die 120 including clock interface circuitry according to another embodiment. The semiconductor die 120 includes a clock interface circuit 101, a core circuit 102, a power high supply pin VDD, a power low supply pin VSS, a first clock interface pin SYNCP, and a second clock interface pin SYNCN.

In the illustrated embodiment, the clock interface circuit 101 includes a first hysteretic comparator 103, a second hysteretic comparator 104, a digital logic circuit 105, a clock buffer 106, an oscillator 107, a multiplexer 108, and a reference voltage source 109.

As shown in FIG. 3, the reference voltage source 109 generates a reference voltage for the first hysteretic comparator 103 and the second hysteretic comparator 104 based on shifting the supply voltage received on the power high supply pin VDD. For example, in certain implementations, the reference voltage corresponds to $V_{DD}-V_B$, where $V_{DD}$ is the voltage level of the power high supply pin VDD and $V_B$ is the voltage of the reference voltage source 109.

The first hysteretic comparator 103 generates a first comparison signal COMPP based on comparing the voltage level of the first clock interface pin SYNCP to the reference voltage, while the second hysteretic comparator 104 generates a second comparison signal COMPN based on comparing the voltage level of the second clock interface pin SYNCN to the reference voltage.

With continuing reference to FIG. 3, the digital logic circuit 105 processes the first comparison signal COMPP and the second comparison signal COMPN to generate an oscillator enable signal OSCEN, which is used to both enable the oscillator 107 and to control selection of the multiplexer 108.

The clock buffer 106 includes a differential input connected to the first clock interface pin SYNCP and the second clock interface pin SYNCN. The clock buffer 106 further includes an output that provides a synchronized clock signal $V_{SYNC}$ to a first signal input of the multiplexer 108. When enabled, the oscillator 107 provides an oscillator signal $V_{OSC}$ to a second signal input of the multiplexer 108. The multiplexer 108 outputs a clock signal $V_{CLK}$ to the core circuit 102.

In the illustrated embodiment, the first hysteretic comparator 103 and the second hysteretic comparator 104 compare the reference voltage from the reference voltage source 109 to the voltage level of the first clock interface pin SYNCP and the second clock interface pin SYNCN, respectively. Using hysteretic comparators provides a number of advantages, such as providing hysteresis to inhibit noise from inadvertently changing the result of the comparisons during operation.

Based on the result of the comparisons, the digital logic circuit 105 sets the clock interface circuit 101 in either a first clock control mode or a second clock control mode. Thus, the voltage levels of the first clock interface pin SYNCP and the second clock interface pin SYNC relative to the reference voltage used for comparison determine whether the clock interface circuit 101 operates in the first clock control mode or the second clock control mode. In certain implementations, the second clock control mode is chosen when the voltage levels of the clock interface pins are both greater than the reference voltage, otherwise the first clock control mode is chosen.

In the illustrated embodiment, when operating in the first clock control mode, the oscillator 107 is disabled, and the synchronized clock signal $V_{SYNC}$ is selected by the multiplexer 108 to serve as the clock signal $V_{CLK}$ for the core circuit 102. Aside from a delay of the clock buffer 106, the synchronized clock signal $V_{SYNC}$ is synchronized to a differential input clock signal received between the first clock interface pin SYNCP and the second clock interface pin SYNCN. Using a pair of differential clock interface pins allows a differential input clock signal to be supplied in the first clock control mode, which provides the advantage of lower clock noise and/or reduced jitter relative to a single-ended configuration.

With continuing reference to FIG. 3, when operating in the second clock control mode, the oscillator 107 is enabled, and the oscillator signal $V_{OSC}$ is selected by the multiplexer 108 to serve as the clock signal $V_{CLK}$ for the core circuit 102. In this embodiment, the frequency of the oscillator 107 is not tuned by the voltage level(s) of the clock interface pins.

Figure 4:
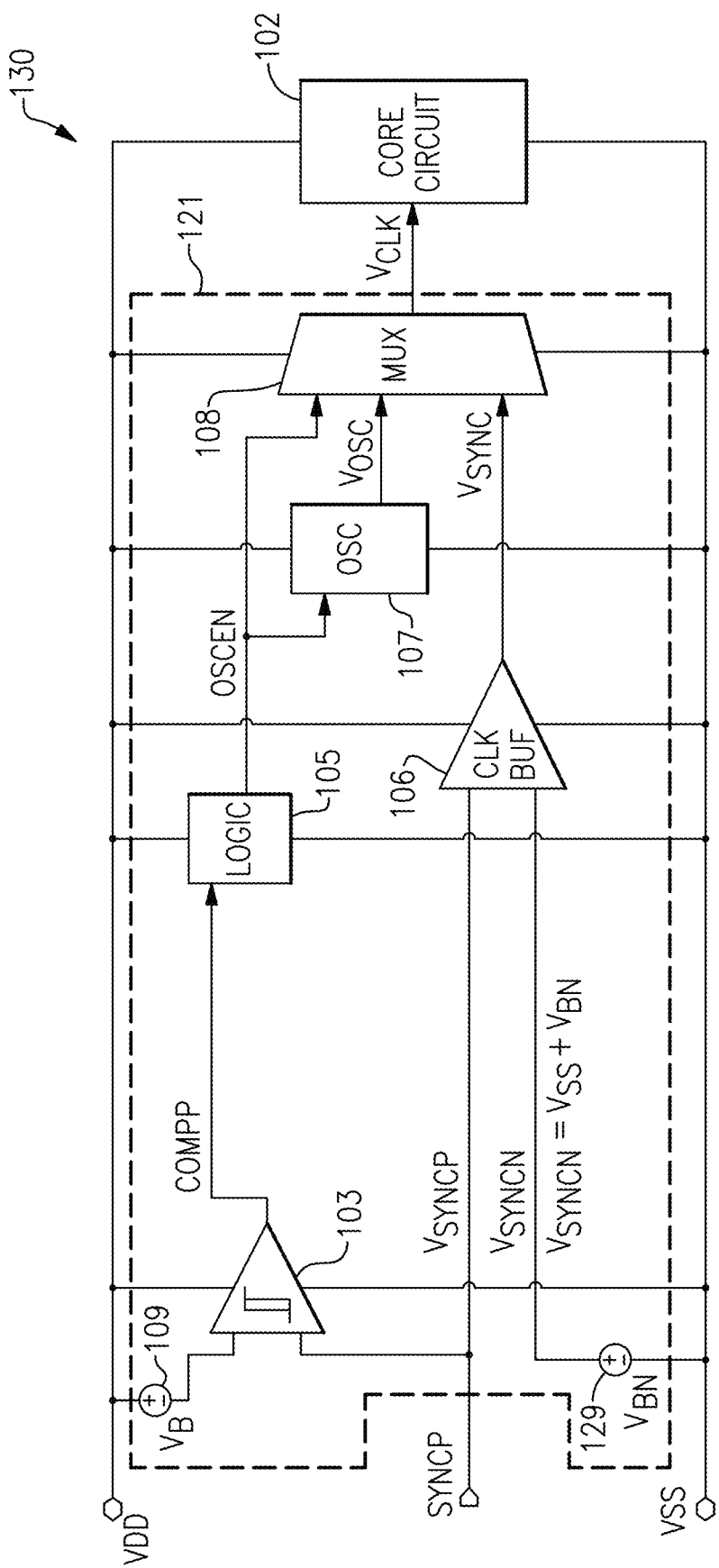
FIG. 4 is a schematic diagram of a semiconductor die including clock interface circuitry according to another embodiment.

FIG. 4 is a schematic diagram of a semiconductor die 130 including clock interface circuitry according to another embodiment. The semiconductor die 130 includes a clock interface circuit 121, a core circuit 102, a power high supply pin VDD, a power low supply pin VSS, and a clock interface pin SYNCP. The clock interface circuit 121 includes a hysteretic comparator 103, a digital logic circuit 105, a clock buffer 106, an oscillator 107, a multiplexer 108, a first reference voltage source 109, and a second reference voltage source 129.

In comparison to the semiconductor die 120 of FIG. 3, the semiconductor die 130 of FIG. 4 omits the second clock interface pin SYNCN and the second hysteretic comparator 104. Additionally, the clock interface circuit 121 of FIG. 4 includes the second reference voltage source 129 for generating a clock buffer reference voltage for the clock buffer 106.

As shown in FIG. 4, the second reference voltage source 129 generates the clock buffer reference voltage based on shifting the supply voltage received on the power low supply pin VSS. For example, in certain implementations, the clock buffer reference voltage corresponds to $V_{SS}+V_{BN}$, where $V_{SS}$ is the voltage level of the power low supply pin VSS and $V_{BN}$ is the voltage of the second reference voltage source 129.

When operating in the first clock control mode, the synchronized clock signal VSYNC corresponds to a buffered version of a single-ended input clock signal received on the clock interface pin VSYNCP. In comparison to the semiconductor die 120 of FIG. 3, the semiconductor die 130 has fewer clock interface pins but is more susceptible to noise in the first clock control mode.

Figure 5A:
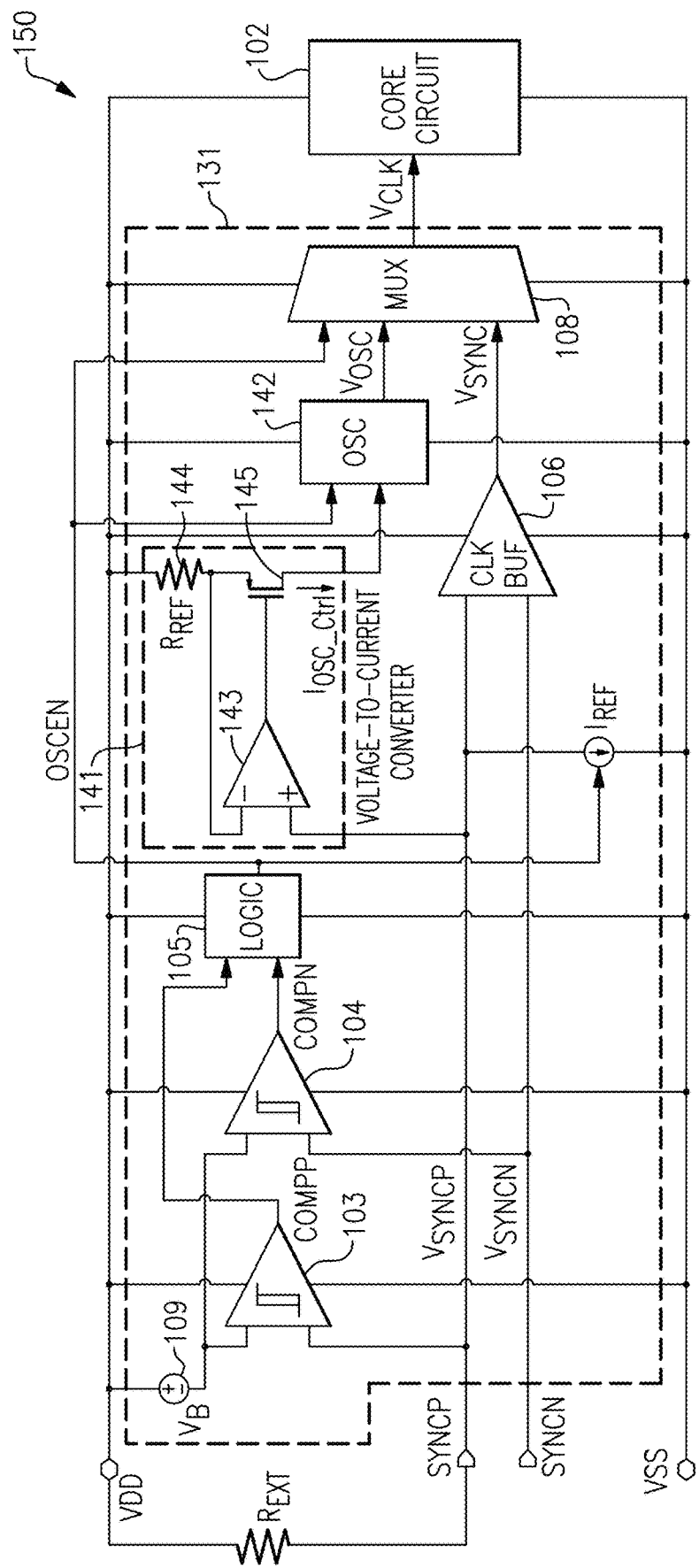
FIG. 5A is a schematic diagram of a semiconductor die including clock interface circuitry according to another embodiment.

FIG. 5A is a schematic diagram of a semiconductor die 150 including clock interface circuitry according to another embodiment. The semiconductor die 150 includes a clock interface circuit 131, a core circuit 102, a power high supply pin VDD, a power low supply pin VSS, a first clock interface pin SYNCP, and a second clock interface pin SYNCN. The clock interface circuit 131 includes a first hysteretic comparator 103, a second hysteretic comparator 104, a digital logic circuit 105, a clock buffer 106, a multiplexer 108, a reference voltage source 109, a voltage-to-current converter 141, an oscillator 142, and a current source $I_{REF}$. In the illustrated embodiment, the voltage-to-current converter 141 include an amplifier 143, a reference resistor 144 (with resistance $R_{REF}$), and a transistor 145.

In comparison to the clock interface circuit 101 of FIG. 3, the clock interface circuit 131 of FIG. 5A further includes the voltage-to-current converter 141 and the current source $I_{REF}$. When operating in the second clock control mode, the current source $I_{REF}$ is enabled and the voltage-to-current converter 141 generates a control current $I_{OSC\_Ctrl}$ that changes in relation to the voltage level of the first clock interface pin SYNCP. The control current $I_{OSC\_Ctrl}$ is used to tune the oscillation frequency of the oscillator 142.

Thus, when operating in the second clock control mode, the voltage level of the first clock interface pin SYNCP is used to tune the frequency of the oscillator 142 and thus the frequency of the clock signal VCLK provided to the core circuit 102. Thus, flexibility is enhanced by providing a mechanism for oscillator frequency control.

For example, one expression for the control current $I_{OSC\_Ctrl}$ is $I_{REF}*R_{EXT}/R_{REF}$, and thus the control current $I_{OSC\_Ctrl}$ increases with the external resistor's resistance.

In the illustrated embodiment, the voltage level of the first clock interface pin SYNCP is set using an external resistor $R_{EXT}$. However, other implementations of setting of the voltage level of the first clock interface pin SYNCP are possible.

Figure 5B:
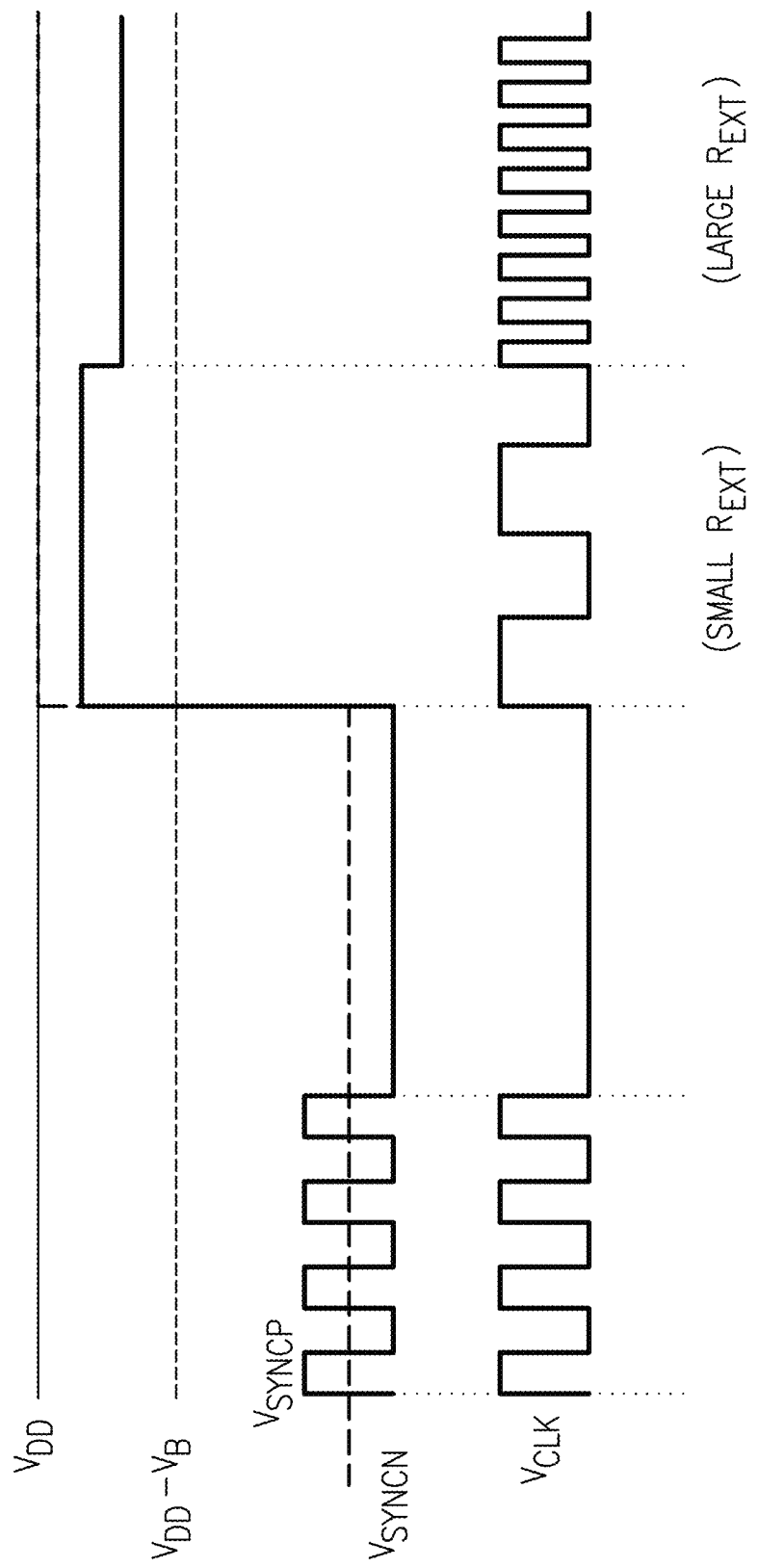
FIG. 5B is one example of a graph depicting operation of the semiconductor die of FIG. 5A.

FIG. 5B is one example of a graph depicting operation of the semiconductor die 150 of FIG. 5A.

The graph depicts a first time period depicting operation in the first clock control mode with the input clock signal toggling. Additionally, the graph depicts a second time period depicting operation in the first clock control mode with the input clock signal not toggling. As shown in FIG. 5B, when operating in the first clock control mode, the frequency of the input clock signal can be changed as needed, and/or the input clock signal can be stopped and resumed as desired.

With continuing reference to FIG. 5B, the graph further includes a third time period depicting operation in the second clock control mode with a small resistance value $R_{EXT}$. Furthermore, the graph further includes a fourth time period depicting operation in the second clock control mode with a large resistance value $R_{EXT}$. As shown in FIG. 5B, when operating in the second clock control mode, the frequency of clock interface control circuit's oscillator can be tuned based on a resistance value selected for an external resistor.

Figure 6:
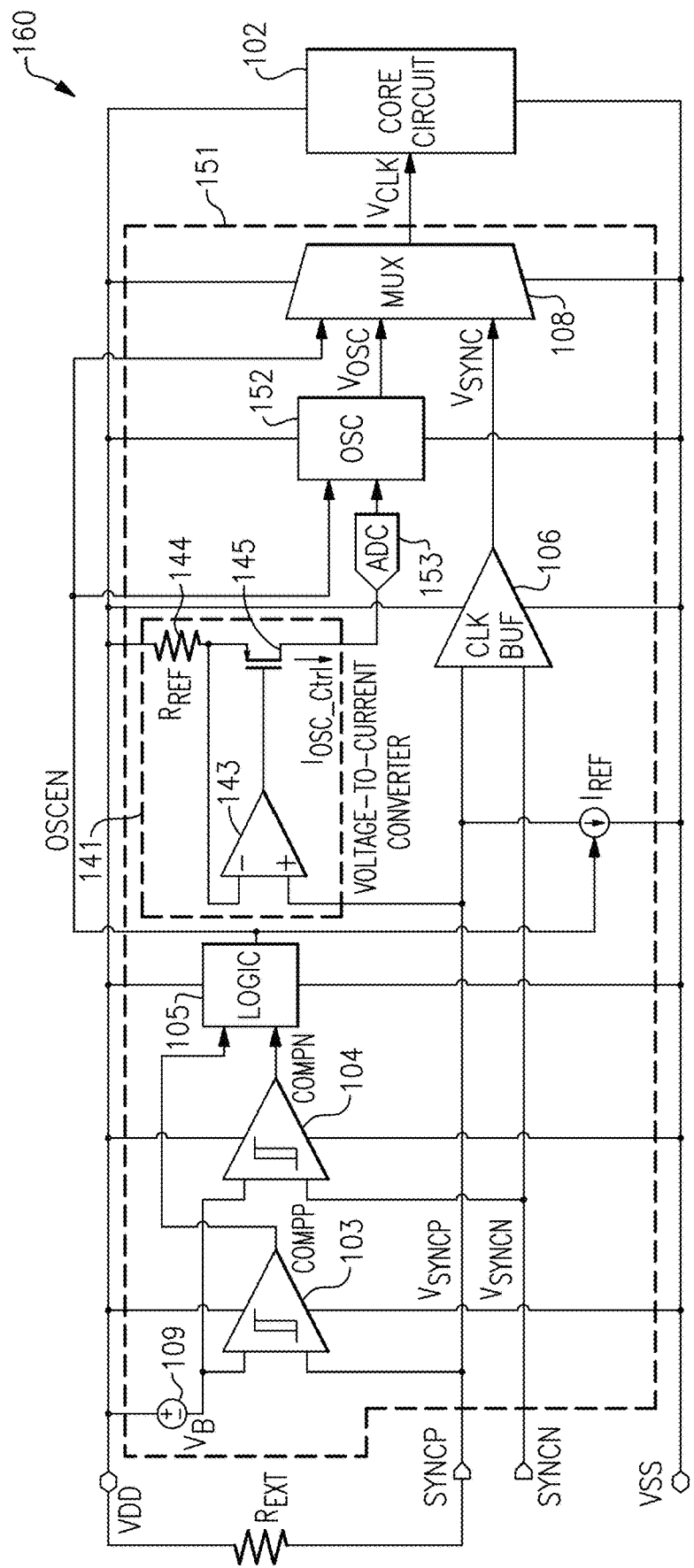
FIG. 6 is a schematic diagram of a semiconductor die including clock interface circuitry according to another embodiment.

FIG. 6 is a schematic diagram of a semiconductor die 160 including clock interface circuitry according to another embodiment. The semiconductor die 160 includes a clock interface circuit 151, a core circuit 102, a power high supply pin VDD, a power low supply pin VSS, a first clock interface pin SYNCP, and a second clock interface pin SYNCN. The clock interface circuit 151 includes a first hysteretic comparator 103, a second hysteretic comparator 104, a digital logic circuit 105, a clock buffer 106, a multiplexer 108, a reference voltage source 109, a voltage-to-current converter 141, a current source $I_{REF}$, an oscillator 152, and an ADC 153.

The clock interface circuit 151 of FIG. 6 is similar to the clock interface circuit 131 of FIG. 5A, except that the clock interface circuit 151 further includes an ADC 153 for digitizing the controllable current from the current-to-voltage converter 141. Additionally, the ADC 153 provides a digital tuning signal to the oscillator 152.

Accordingly, digital tuning of the oscillator 152 is provided. Using digital tuning provides a number of advantages, including, but not limited to, flexibility in digitally processing the digital control signal using any desired processing, such as shaping, compensation for variation, and/or other processing.

FIGS. 7A-7D depict various examples of core circuits receiving a clock signal from a clock interface circuit. Although various applications of clock interface circuits are depicted, clock interface circuits can be used to generate a clock signal for a wide variety of core circuits. Accordingly, other implementations are possible.

FIG. 7A is a schematic diagram of another embodiment of a semiconductor die 210. The semiconductor die 210 includes a clock interface circuit 191 and a chopper amplifier 192. Pins coupled to the clock interface circuit 191 and components of the clock interface circuit 191 are not depicted in FIG. 7A for clarity of the figure. However, the clock interface circuit 191 can be implemented in accordance with any of the embodiments herein.

In the illustrated embodiment, the chopper amplifier 192 includes an input chopping circuit 201, an amplification circuit 202, and an output chopping circuit 203 electrically connected along a differential signal path between a pair of input terminals ($V_{IN+}$, $V_{IN-}$) and a pair of output terminals ($V_{OUT+}$, $V_{OUT-}$).

As shown in FIG. 7A, the clock interface circuit 191 generates a clock signal CLK, which is used to control chopping operations of the input chopping circuit 201 and the output chopping circuit 203.

When operating in the first clock control mode, the input chopping circuit 201 can be controlled by an input clock signal that is synchronized with external components (for instance, an ADC that digitizes an output voltage of the chopper amplifier 192), thereby avoiding aliasing. Additionally, when operating in the first clock control mode, the input clock signal can be stopped as desired to provide continuous amplification without chopping, and then resumed when chopping is desired.

Moreover, when operating in the second clock control mode, an oscillator of the clock interface circuit 191 generates the clock signal CLK. Thus, chopping can be controlled using an internal self-clock, which can be tunable to a user-selected frequency by setting a voltage level of a clock interface pin.

FIG. 7B is a schematic diagram of another embodiment of a semiconductor die 220. The semiconductor die 220 includes a clock interface circuit 191 and an ADC 212. Pins coupled to the clock interface circuit 191 and components of the clock interface circuit 191 are not depicted in FIG. 7B for clarity of the figure. However, the clock interface circuit 191 can be implemented in accordance with any of the embodiments herein.

In the illustrated embodiment, the ADC 212 receives an input signal IN and generates a digital output signal DOUT. Timing of data conversion operations of the ADC 212 is controlled by the clock signal CLK from the clock interface circuit 191.

FIG. 7C is a schematic diagram of another embodiment of a semiconductor die 230. The semiconductor die 230 includes a clock interface circuit 191 and a DAC 222. Pins coupled to the clock interface circuit 191 and components of the clock interface circuit 191 are not depicted in FIG. 7C for clarity of the figure. However, the clock interface circuit 191 can be implemented in accordance with any of the embodiments herein.

In the illustrated embodiment, the DAC 222 receives a digital input signal DIN and generates an output signal OUT. Timing of data conversion operations of the DAC 222 is controlled by the clock signal CLK from the clock interface circuit 191.

FIG. 7D is a schematic diagram of another embodiment of a semiconductor die 240. The semiconductor die 240 includes a clock interface circuit 191 and a switching regulator 232. Pins coupled to the clock interface circuit 191 and components of the clock interface circuit 191 are not depicted in FIG. 7D for clarity of the figure. However, the clock interface circuit 191 can be implemented in accordance with any of the embodiments herein.

In the illustrated embodiment, the switching regulator 232 generates a regulated voltage $V_{REG}$ based on timing of the clock signal CLK from the clock interface circuit 191. Thus, switches of the switching regulator 232 can be opened or closed to control regulation. For example, the switching regulator 232 can correspond to a buck converter or boost converter having switches used to control a current delivered to an inductor.

Figure 8A:
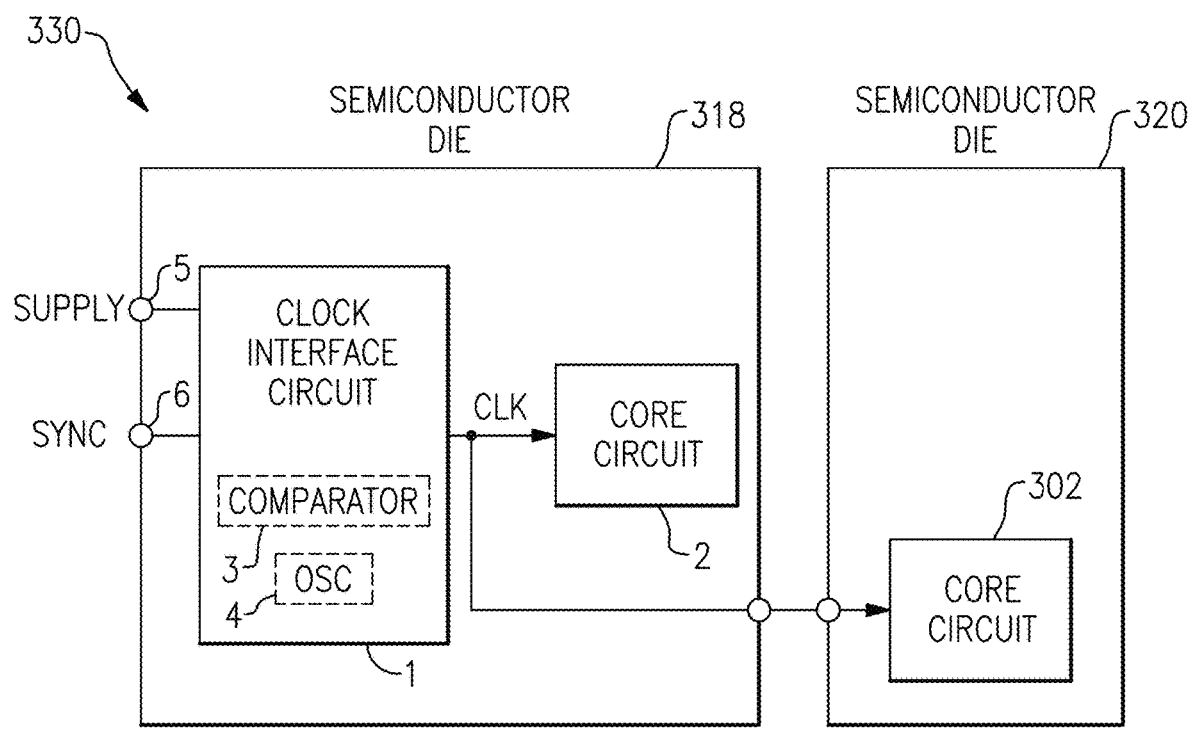
FIG. 8A is a schematic diagram of an electronic system according to another embodiment.

FIG. 8A is a schematic diagram of an electronic system 330 according to another embodiment. The electronic system 330 includes a first semiconductor die 318 and a second semiconductor die 320.

The first semiconductor die 318 is similar to the semiconductor die 10 of FIG. 1, except that the semiconductor die 318 of FIG. 8A also outputs the clock signal CLK on a clock output pin. As shown in FIG. 8A, the clock signal CLK is provided from the first semiconductor die 318 to a core circuit 302 of the second semiconductor die 320. In certain implementations, the first semiconductor die 318 and the second semiconductor die 320 are co-packaged on a module.

Figure 8B:
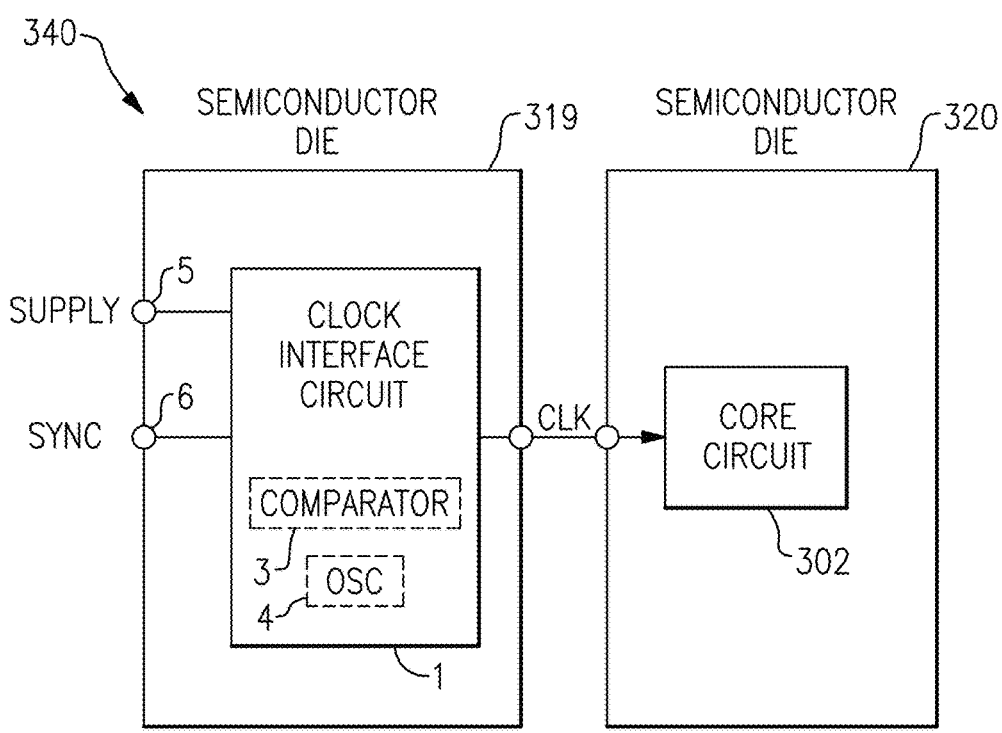
FIG. 8B is a schematic diagram of an electronic system according to another embodiment.

FIG. 8B is a schematic diagram of an electronic system 340 according to another embodiment. The electronic system 340 includes a first semiconductor die 319 and a second semiconductor die 320.

The first semiconductor die 319 of FIG. 8B is similar to the first semiconductor die 318 of FIG. 8A, except that the semiconductor die 319 of FIG. 8B omits the core circuit 2. Thus, the first semiconductor die 319 does not include the core circuit 2, but rather outputs the clock signal CLK on a clock output pin to provide the core circuit 302 of the second semiconductor die 320.

Applications

Devices employing the above described schemes can be implemented into various electronic devices. Examples of electronic devices include, but are not limited to, consumer electronic products, electronic test equipment, communication systems, data converters, etc.

CONCLUSION

The foregoing description may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while the disclosed embodiments are presented in a given arrangement, alternative embodiments may perform similar functionalities with different components and/or circuit topologies, and some elements may be deleted, moved, added, subdivided, combined, and/or modified. Each of these elements may be implemented in a variety of different ways. Any suitable combination of the elements and acts of the various embodiments described above can be combined to provide further embodiments. Accordingly, the scope of the present invention is defined only by reference to the appended claims.

Although the claims presented here are in single dependency format for filing at the USPTO, it is to be understood that any claim may depend on any preceding claim of the same type except when that is clearly not technically feasible.

What is claimed is:

1. A semiconductor die with clock control, the semiconductor die comprising:
    a plurality of pins comprising a supply pin, a first clock interface pin, and a second clock interface pin; and
    a clock interface circuit configured to output a clock signal, the clock interface circuit coupled to the supply pin and the first clock interface pin, wherein the clock interface circuit comprises:
        an oscillator configured to generate an oscillator signal; and
        a first comparator configured to control operation of the clock interface circuit in a selected clock control mode chosen from two or more clock control modes based on comparing an electrical characteristic of the first clock interface pin to a comparison threshold,
        wherein the two or more clock control modes includes a first clock control mode in which the clock interface circuit generates the clock signal based on an input clock signal received on the clock interface pin, and a second clock control mode in which the clock interface circuit generates the clock signal based on the oscillator signal, wherein the input clock signal is received differentially between the first clock interface pin and the second clock interface pin in the first clock control mode.

2. The semiconductor die of claim 1, wherein a voltage level of the first clock interface pin tunes an oscillation frequency of the oscillator in the second clock control mode.

3. The semiconductor die of claim 1, wherein the clock interface control circuit further comprises a second comparator configured to compare an electrical characteristic of the second clock interface pin to the comparison threshold, and a digital logic circuit configured to receive a first comparison signal from the first comparator and a second comparison signal from the second comparator.

4. The semiconductor die of claim 1, wherein the clock interface circuit further comprises a voltage source configured to generate the comparison threshold based on a voltage level of the supply pin.

5. The semiconductor die of claim 1, further comprising a chopper amplifier having an input chopping circuit and an output chopping circuit controlled by the clock signal.

6. A semiconductor die with clock control, the semiconductor die comprising:
    a plurality of pins comprising a supply pin and a first clock interface pin; and
    a clock interface circuit configured to output a clock signal, the clock interface circuit coupled to the supply pin and the first clock interface pin, wherein the clock interface circuit comprises:
        an oscillator configured to generate an oscillator signal; and
        a first comparator configured to control operation of the clock interface circuit in a selected clock control mode chosen from two or more clock control modes based on comparing an electrical characteristic of the first clock interface pin to a comparison threshold,
        wherein the two or more clock control modes includes a first clock control mode in which the clock interface circuit generates the clock signal based on an input clock signal received on the clock interface pin, and a second clock control mode in which the clock interface circuit generates the clock signal based on the oscillator signal, wherein a voltage level of the first clock interface pin tunes an oscillation frequency of the oscillator in the second clock control mode, wherein the clock interface circuit further comprises a voltage-to-current converter configured to convert covert the voltage level of the first clock interface pin to a control current.

7. The semiconductor die of claim 6, wherein the clock interface circuit further comprises an analog-to-digital converter (ADC) configured to convert the control current into a digital control signal that controls the oscillation frequency of the oscillator.

8. The semiconductor die of claim 6, wherein the clock interface circuit further comprises a current source connected to the first clock interface pin, wherein the current source is disabled in the first clock control mode and enabled in the second clock control mode.

9. A semiconductor die with clock control, the semiconductor die comprising:
a plurality of pins comprising a supply pin and a first clock interface pin; and
a clock interface circuit configured to output a clock signal, the clock interface circuit coupled to the supply pin and the first clock interface pin, wherein the clock interface circuit comprises:
an oscillator configured to generate an oscillator signal; and
a first comparator configured to control operation of the clock interface circuit in a selected clock control mode chosen from two or more clock control modes based on comparing an electrical characteristic of the first clock interface pin to a comparison threshold,
wherein the two or more clock control modes includes a first clock control mode in which the clock interface circuit generates the clock signal based on an input clock signal received on the clock interface pin, and a second clock control mode in which the clock interface circuit generates the clock signal based on the oscillator signal,
wherein the clock interface circuit further comprises a clock buffer having an input coupled to the first clock interface pin and an output configured to provide a synchronized clock signal, and a multiplexer having a first signal input configured to receive the synchronized clock signal and a second signal input configured to receive the oscillator signal.

10. The semiconductor die of claim 9, wherein the clock interface circuit further comprises a digital logic circuit configured to control selection of the multiplexer based on a comparator output signal from the first comparator, wherein an output of the multiplexer controls the clock signal.

11. A method of clock control in an electronic system, the method comprising:
controlling timing of a core circuit using a clock signal provided by a clock interface circuit coupled to a supply pin and a first clock interface pin;
comparing an electrical characteristic of the first clock interface pin to a comparison threshold using a comparator of the clock interface circuit; and
operating the clock interface circuit in a selected clock control mode chosen from two or more clock control modes based on the comparison, including generating the clock signal based on an input clock signal received on the clock interface pin in a first clock control mode, and generating the clock signal using an oscillator of the clock interface circuit in a second clock control mode,
wherein the plurality of pins further comprises a second clock interface pin, wherein the method further comprises receiving the input clock signal differentially between the first clock interface pin and the second clock interface pin in the first clock control mode.

12. The method of claim 11, further comprising tuning an oscillation frequency of the oscillator based on a voltage level of the first clock interface pin in the second clock control mode.

13. The method of claim 11, further comprising generating the comparison threshold based on a voltage level of the supply pin.

14. An electronic system comprising:
a power supply configured to generate a supply voltage;
a first semiconductor die comprising:
a supply pin configured to receive the supply voltage;
a clock interface pin; and
a clock interface circuit configured to output a clock signal, wherein the clock interface circuit comprises an oscillator configured to generate an oscillator signal, and a first comparator configured to control operation of the clock interface circuit in a selected clock control mode chosen from two or more clock control modes based on comparing an electrical characteristic of the first clock interface pin to a comparison threshold,
wherein the two or more clock control modes includes a first clock control mode in which the clock interface circuit generates the clock signal based on an input clock signal received on the clock interface pin, and a second clock control mode in which the clock interface circuit generates the clock signal based on the oscillator signal; and
an external resistor connected between the supply pin and the first clock interface pin.

15. The electronic system of claim 14, wherein an oscillation frequency of the oscillator changes based on a resistance of the external resistor.

16. The electronic system of claim 14, further comprising an external clock source configured to provide the clock signal to the first clock interface pin.

17. The electronic system of claim 14, further comprising a second semiconductor die comprising a core circuit that receives the clock signal.

18. The electronic system of claim 14, wherein a voltage level of the clock interface pin tunes an oscillation frequency of the oscillator in the second clock control mode.

19. The electronic system of claim 18, wherein the clock interface circuit further comprises a voltage-to-current converter configured to convert the voltage level of the clock interface pin to a control current.

20. The electronic system of claim 19, wherein the clock interface circuit further comprises an analog-to-digital converter (ADC) configured to convert the control current into a digital control signal that controls the oscillation frequency of the oscillator.

* * * * *

UNITED STATES PATENT AND TRADEMARK OFFICE
CERTIFICATE OF CORRECTION

| | |
|---|---|
| PATENT NO. | : 11,442,494 B2 |
| APPLICATION NO. | : 16/946142 |
| DATED | : September 13, 2022 |
| INVENTOR(S) | : Yoshinori Kusuda |

It is certified that error appears in the above-identified patent and that said Letters Patent is hereby corrected as shown below:

In the Claims

Column 13, Line 7 (approx.) (first occurrence), Claim 6, before "the" delete "covert".

Signed and Sealed this
Third Day of January, 2023

Katherine Kelly Vidal
*Director of the United States Patent and Trademark Office*